(12) United States Patent
Humphrey et al.

(10) Patent No.: US 10,658,840 B2
(45) Date of Patent: May 19, 2020

(54) CURRENT RESTRICTION FOR A POWER SOURCE

(71) Applicant: Hewlett Packard Enterprise Development LP, Houston, TX (US)

(72) Inventors: Daniel Humphrey, Tomball, TX (US); Michael Delany, Houston, TX (US); Mohamed Amin Bemat, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/568,460

(22) PCT Filed: Jul. 17, 2015

(86) PCT No.: PCT/US2015/040880
§ 371 (c)(1),
(2) Date: Oct. 20, 2017

(87) PCT Pub. No.: WO2017/014720
PCT Pub. Date: Jan. 26, 2017

(65) Prior Publication Data
US 2018/0143263 A1 May 24, 2018

(51) Int. Cl.
*H02J 3/06* (2006.01)
*H02J 9/00* (2006.01)
(Continued)

(52) U.S. Cl.
CPC .................. *H02J 3/06* (2013.01); *H02J 1/10* (2013.01); *H02J 9/00* (2013.01); *G05F 1/44* (2013.01)

(58) Field of Classification Search
CPC ....... H02J 3/06; H02J 9/00; H02J 1/10; G05F 1/44
See application file for complete search history.

(56) References Cited

U.S. PATENT DOCUMENTS

| 4,659,942 A | 4/1987 | Volp |
| 5,654,859 A | 8/1997 | Shi |

(Continued)

FOREIGN PATENT DOCUMENTS

| CA | 2925463 A1 | 4/2015 |
| CN | 202333957 U | 7/2012 |

OTHER PUBLICATIONS

L.S. Ezema, "Design of Automatic Change Over Switch with Generator Control Mechanism," Nov. 2012, 6 pps, <http://www.savap.org.pk/journals/ARInt./Vol.3(3)/2012(3.3-16).pdf>.
(Continued)

*Primary Examiner* — Fred E Finch, III
*Assistant Examiner* — Rafael O. De León Domenech (57) ABSTRACT

An example system includes a failure detection circuit. The failure detection circuit is to detect a failure of a first power source electrically coupled to a first load. The failure detection circuit is to output a first signal indicating the detection of the failure of the first power source. The system also includes a current regulating circuit. The current regulating circuit is electrically coupled to the failure detection circuit. The current regulating circuit is to electrically couple a second power source to the first load based on the first signal output by the failure detection circuit. The current regulating circuit is to restrict a first current from the second power source.

9 Claims, 7 Drawing Sheets

(51) Int. Cl.
   *H02J 1/10*   (2006.01)
   *G05F 1/44*   (2006.01)

(56)        References Cited

U.S. PATENT DOCUMENTS

| | | | |
|---|---|---|---|
| 5,798,668 A | 8/1998 | George | |
| 7,893,560 B2 | 2/2011 | Carter | |
| 8,096,387 B2 | 1/2012 | Kattainen | |
| 2003/0168913 A1* | 9/2003 | Kinnard | H02J 1/10 307/29 |
| 2005/0035656 A1 | 2/2005 | Kuramochi et al. | |
| 2006/0262464 A1* | 11/2006 | Bemat | H02J 1/102 361/18 |
| 2008/0150483 A1 | 6/2008 | Morita et al. | |
| 2009/0058500 A1* | 3/2009 | Osawa | H01L 23/49562 327/434 |
| 2010/0026392 A1 | 2/2010 | Wong | |
| 2012/0169453 A1 | 7/2012 | Bryla et al. | |
| 2013/0062949 A1* | 3/2013 | Yan | H02J 9/061 307/64 |
| 2013/0162035 A1* | 6/2013 | Sullivan | H02H 7/261 307/18 |
| 2013/0221750 A1 | 8/2013 | Togare | |
| 2014/0085760 A1 | 3/2014 | Lui | |
| 2014/0313797 A1 | 10/2014 | Davidson | |
| 2015/0102668 A1 | 4/2015 | Jeon et al. | |
| 2016/0280394 A1 | 9/2016 | Radun et al. | |

OTHER PUBLICATIONS

Extended European Search Report, EP Application No. 15899044.0, dated Sep. 5, 2018, pp. 1-11, EPO.

* cited by examiner

```
┌─────────────────────────────────────────────┐
│ Electrically Couple a Failure Detection     │
│ Circuit to a Control Terminal of a First    │
│ Switch                                      │
│ 402                                         │
└─────────────────────────────────────────────┘
                      │
┌─────────────────────────────────────────────┐
│ Couple a First Plurality of Diodes and the  │
│ First Switch in Series with Each Other      │
│ 404                                         │
└─────────────────────────────────────────────┘
                      │
┌─────────────────────────────────────────────┐
│ Couple the First Plurality of Diodes and    │
│ the First Switch to a First Power Source    │
│ 406                                         │
└─────────────────────────────────────────────┘
                      │
┌─────────────────────────────────────────────┐
│ Couple the First Plurality of Diodes and    │
│ the First Switch to a Load                  │
│ 408                                         │
└─────────────────────────────────────────────┘
                      │
┌─────────────────────────────────────────────┐
│ Couple a Second Plurality of Diodes and a   │
│ Second Switch in Series with Each Other     │
│ 410                                         │
└─────────────────────────────────────────────┘
                      │
┌─────────────────────────────────────────────┐
│ Couple the Second Plurality of Diodes and   │
│ the Second Switch to the First Power Source │
│ 412                                         │
└─────────────────────────────────────────────┘
                      │
┌─────────────────────────────────────────────┐
│ Couple the Second Plurality of Diodes and   │
│ the Second Switch to the Load               │
│ 414                                         │
└─────────────────────────────────────────────┘
```

CURRENT RESTRICTION FOR A POWER SOURCE

BACKGROUND

A power source may deliver power to a load. For example, the power source and the load may be electrically coupled by a high potential rail and a low potential rail. The flow of power from the power source to the load may be interrupted, for example due to a failure of the power source, a failure upstream of the power source, scheduled repairs or replacement of the power source, or the like. A backup power source may be electrically coupled to the load to provide power to the load until the failures are remedied or the repairs completed.

DETAILED DESCRIPTION

The voltage output of a power source may drop significantly before a failure detection circuit detects a power failure. For example, the power source may be an alternating current (AC)-to-direct current (DC) converter that includes a ripple voltage at the output, so the failure detection circuit may wait for the voltage to drop enough for the failure detection circuit to be certain that a power source failure is detected rather than just a ripple. A backup power source may be electrically coupled to the load by placing a switch in an active state or the like in response to detecting the power source failure. Because the voltage has dropped significantly, a large current may flow from the backup power source across the switch when the backup power source is initially coupled to the load. For example, the load may include a large parallel capacitance, or there may be a large capacitance in parallel with the load. When the switch electrically couples the large capacitance to the backup power source, it may result in a sudden increase in voltage across the large capacitance. The sudden increase in voltage causes the large capacitance to draw a large current from the backup power source. For example, the difference in voltage between the power source and backup power source may be 30 Volts for power sources with 10 Volt ripples, and the resulting current may be over 700 Amps.

The large current may damage the switch, and the switch may no longer continue to function properly. To prevent damage from the large currents, the switch may be oversized relative to the currents that will be carried after the initial switching. However, the cost and space requirements for the oversized switch are significant. Accordingly, there is a need for a small, low cost device to couple a backup power source to a load without allowing a large current. For example, a device that allows no more than 20, 50, 100, 150, 200 Amps, or the like to flow from the backup power source to the load.

Figure 1:
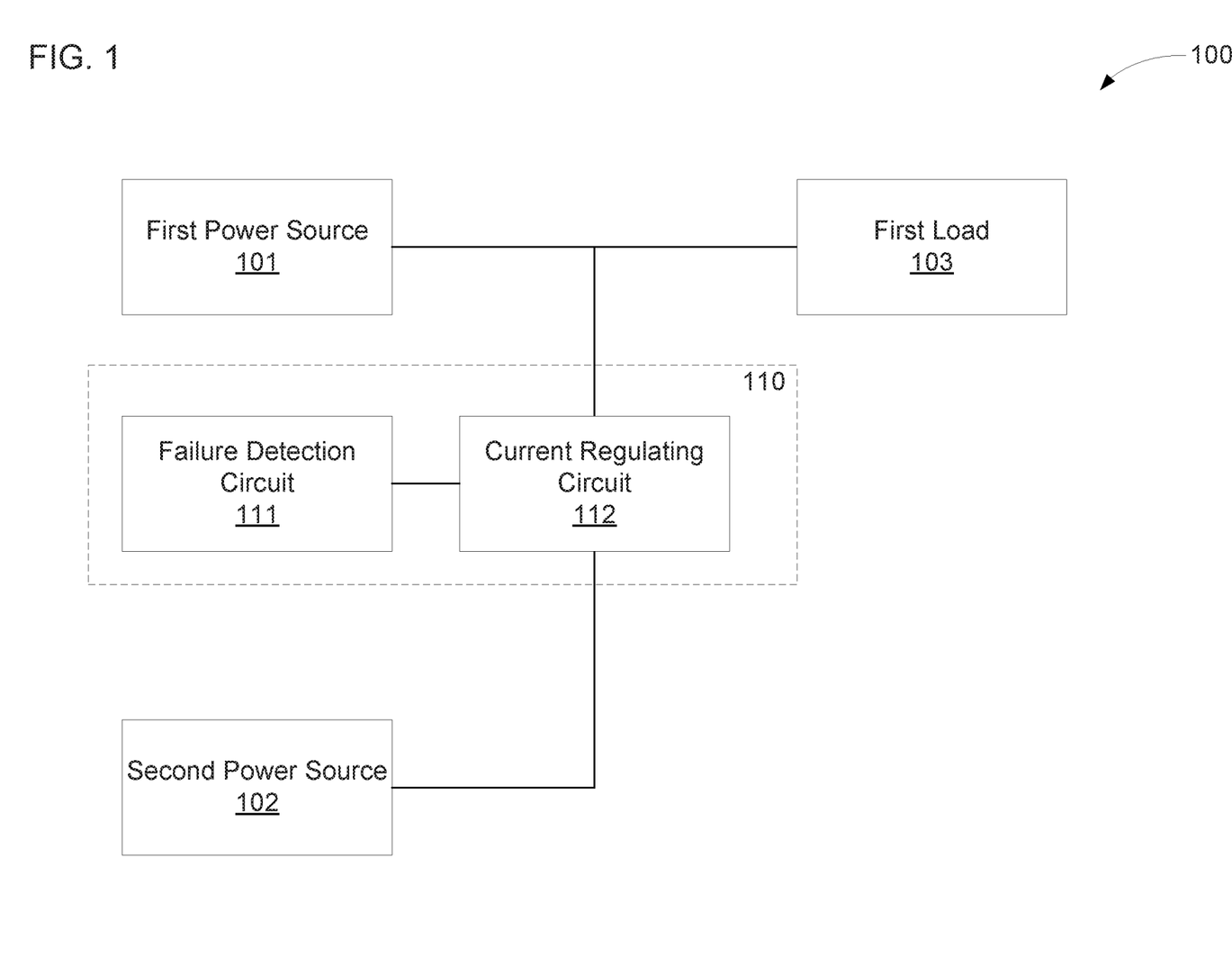
FIG. 1 is a block diagram of an environment containing an example system to restrict current from a second power source based on a failure of a first power source.

FIG. 1 is a block diagram of an environment 100 containing an example system 110 to restrict current from a second power source 102 based on a failure of a first power source 101. The environment 100 may include a first load 103 electrically coupled to the first power source 101. As used herein, the term "electrically coupled" refers to components with a conduction path for electrical energy (i.e., current) in at least one direction between the components. Current does not need to be flowing along the conduction path for the components to be electrically coupled. The components may be directly coupled with a conduction path including only low impedance wires and the like, or they may be indirectly coupled with semiconductors or higher impedance components that allow electrical energy to flow along the conduction path. The first and second power sources 101, 102 may be AC-to-DC converters, DC-to-DC converters, batteries, a DC generator, or the like. The first load 103 may be a DC-to-DC converter, a computer (e.g., a processor, memory, or the like), a battery, or the like.

The system 110 may include a failure detection circuit 111, which may be electrically coupled to the second power source 102 and electrically coupled to the load 103. The failure detection circuit 111 may detect a failure of the first power source 101. For example, the failure detection circuit 111 may detect a decline in the voltage level output by the first power source 101, may receive an indication of a fault from the first power source 101, or the like. In response to detecting the failure, the failure detection circuit 111 may output a signal indicating the detection of the failure of the first power source 101.

The system 110 may include a current regulating circuit 112, which may be electrically coupled to the failure detection circuit 111. The current regulating circuit 112 may electrically couple the second power source 102 to the load 103 based on the signal output by the failure detection circuit 111. As used herein, the term "electrically couple" refers to completing or creating a conduction path for electrical energy between the components being electrically coupled. Current does not need to be flowing along the completed or created conduction path to electrically couple the components. The current regulating circuit 112 may restrict a current from the second power source (e.g., a current that flows through the current regulating circuit 112). As used herein, the term "restrict" a current refers to reducing or limiting the amount of current through a conduction path relative to an unrestricted conduction path without entirely stopping the flow of current. The current regulating circuit 112 may perform low loss restriction of the current. For example, the instantaneous power dissipated at the time of electrical coupling and the total energy dissipated to reach a steady state with the current regulating circuit 112 may be similar to or less than the instantaneous power and total energy dissipated without the current regulating circuit 112.

As used herein, the term "similar" refers to values that are within a particular offset or percentage of each other (e.g., 1%, 2%, 5%, 10%, etc.).

Figure 2:
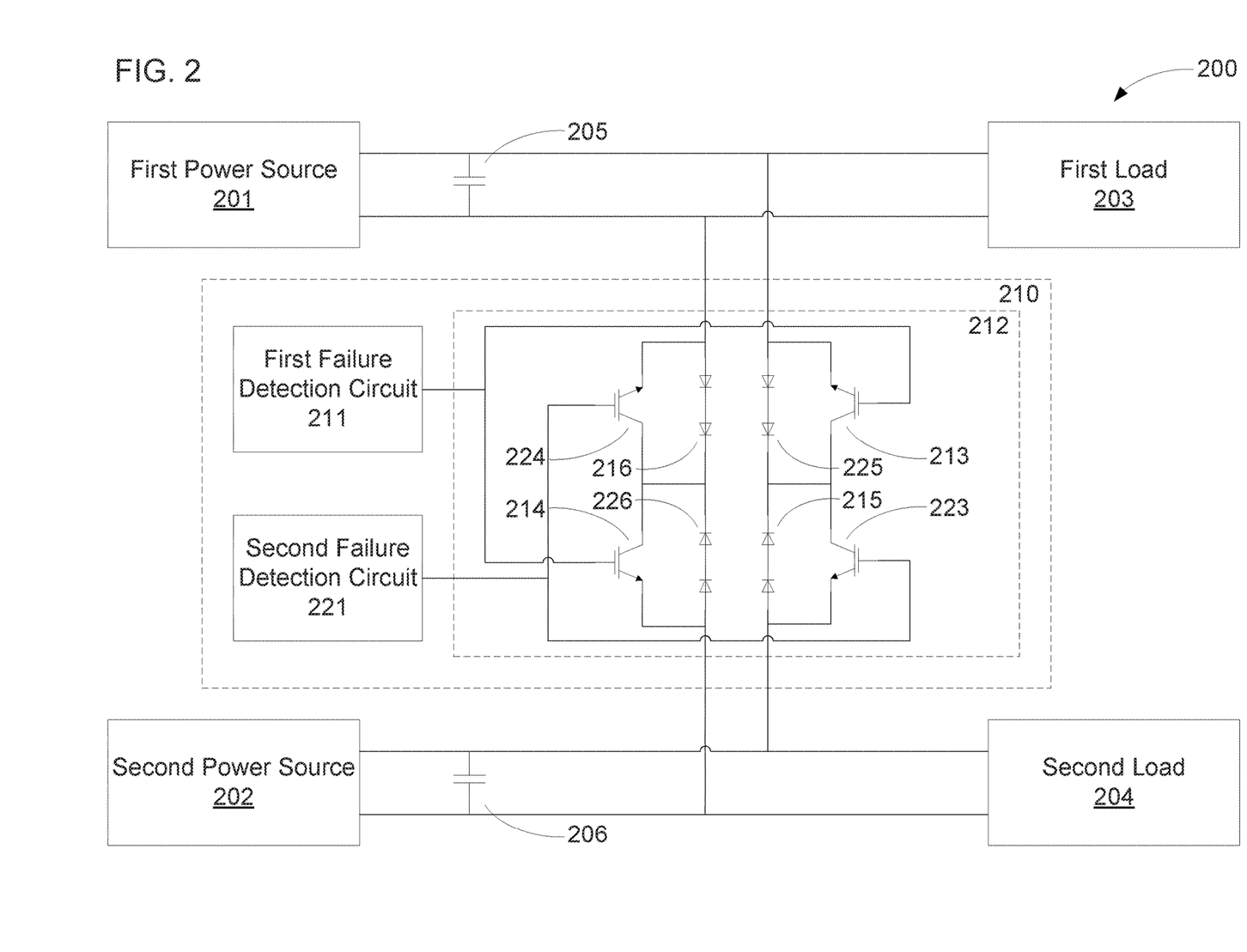
FIG. 2 is a block diagram of another environment containing another example system to restrict current from a first power source or a second power source.

FIG. 2 is a block diagram of another environment 200 containing another example system 210 to restrict current from a first power source 201 or a second power source 202. The environment 200 may include a first power source 201 electrically coupled to a first load 203 and a second power source 202 electrically coupled to a second load 204. In the illustrated example, the environment 200 also includes a first capacitor 205 in parallel with the first load 203 and a second capacitor 206 in parallel with the second load 204. In other examples, the first and second loads 203, 204 may include the first and second capacitors 205, 206 respectively. The first and second capacitors 205, 206 may have large capacitances (e.g., 100, 1,000, 10,000, etc. ρF) to mitigate ripples in the output voltage from the first and second power sources 201, 202. The system 210 may include a current regulating circuit 212 electrically coupled to the first power source 201, the second load 204, the second power source 202, and the first load 203.

The system 210 may selectively couple the first power source 201 to the second load 204 or the second power source 202 to the first load 203 based on detecting a failure of one of the power sources 201, 202. For example, the system 210 may include a first failure detection circuit 211 to detect a failure of the first power 201 source and to signal the current regulating circuit 212 to electrically couple the second power source 202 to the first load 203. The system 210 may also include a second failure detection circuit 221 to detect a failure of the second power source 202 and to signal the current regulating circuit 212 to electrically couple the first power source 201 to the second load 204.

For example, the current regulating circuit 212 may include a plurality of switches 213, 214, 223, 224 controlled by the failure detection circuits 211, 221. In the illustrated example, the switches 213, 214, 223, 224 are insulated-gate bipolar transistors (IGBTs). In other examples, the switches 213, 214, 223, 224 may be metal-oxide-semiconductor field-effect transistors (MOSFETs) (e.g., power MOSFETs, etc.), bipolar junction transistors (BJTs), or the like. The failure detection circuits 211, 221 may signal failures to the current regulating circuit 212 by biasing the switches 213, 214, 223, 224 to which they are coupled to an active state that allows electrical energy to be conducted. For example, each switch 213, 214, 223, 224 may include a control terminal (e.g., a gate, a base, etc.), an input terminal (e.g., an emitter or collector, a source or drain, etc.), and an output terminal (e.g., a collector or emitter, a drain or source, etc.). The failure detection circuits 211, 221 may create a bias voltage or bias current between the control terminal and the input or output terminal to bias the corresponding switches 213, 214, 223, 224 to an active state. The switches 213, 214, 223, 224 may be bidirectional or unidirectional devices and may be p-type or n-type devices. The failure detection circuits 211, 221 may create the appropriate bias for the type of switch to which they are connected.

Each switch 213, 214, 223, 224 may be electrically coupled in series with a corresponding plurality of diodes 215, 216, 225, 226. Each plurality of diodes 215, 216, 225, 226 may include a plurality of diodes electrically coupled in series with each other. When the first failure detection circuit 211 detects a failure of the first power source 201, the first failure detection circuit 211 may bias a first switch 213 to an active state. Electrical energy may flow from a high rail coupled to the second power source 202 through a first plurality of diodes 215 and through the first switch 213 to a high rail coupled to the first load 203 and the first capacitor 205. Similarly, the first failure detection circuit 211 may bias a third switch 214 to an active state to allow electrical energy to flow from a low rail coupled to the first load 203 and the first capacitor 205 though a third plurality of diodes 216 and the third switch 214 to a low rail coupled to the second power source 202.

Correspondingly, the second failure detection circuit 221 may bias a second switch 223 and a fourth switch 224 in response to detecting a failure of the second power source 202. Electrical energy may flow from a high rail coupled to the first power source 201 through a second plurality of diodes 225 and the second switch 223 to a high rail coupled to the second load 204 and the second capacitor 206. Electrical energy may also flow from a low rail coupled to the second load 204 and the second capacitor 206 through a fourth plurality of diodes 226 and the fourth switch 224 to a low rail coupled to the first power source 201. As used herein, the term "rail" refers to a conductor to be maintained at a fixed potential (plus or minus a ripple) when a power source directly coupled to the rail is operating properly. In the illustrated example, the failure detection circuits 211, 221 may selectively couple the high rail coupled to the first power source 201 to the high rail coupled to the second power source 202 and vice versa and may selectively couple the low rail coupled to the second power source 202 to the low rail coupled to the first power source 201 and vice versa. In other examples, one the low rails and the high rails may always be electrically coupled to each other, and the failure detection circuits 211, 221 may selectively couple only one pair of rails.

The plurality of diodes 215, 216, 225, 226 may restrict the current that flows from the second power source 202 through the current regulating circuit 212 or the current that flows from the first power source 201 through the current regulating circuit 212. In some examples, the switches 213, 214, 223, 224 may also restrict the current that flows from the first or second power source 201, 202 through the current regulating circuit 212. The diodes in each plurality 215, 216, 225, 226 may be oriented to allow electrical energy to flow in the direction in which current is restricted. For example, the first plurality of diodes 215 may be oriented to allow current to flow from the high rail coupled to the second power source 202 to the high rail coupled to the first power source 201; the third plurality of diodes 216 may be oriented to allow current to flow from the low rail coupled to the first power source 201 to the low rail coupled to the second power source 202; the second plurality of diodes 225 may be oriented to allow current to flow from the high rail coupled to the first power source 201 to the high rail coupled to the second power source 202; and the fourth plurality of diodes 226 may be oriented to allow current to flow from the low rail coupled to second power source 202 to the low rail coupled to the first power source 201. As used herein, the term "oriented" to allow current to flow refers to a forward bias direction of the diode matching the direction current is to flow.

In the illustrated example, the first plurality of diodes 215 are coupled in parallel with the second switch 223, and the second plurality of diodes 225 are coupled in parallel with the first switch 213. There is a common electrical connection directly coupling the first plurality of diodes 215, the second switch 223, the second plurality of diodes 225, and the first switch 213. In other examples, there may not be a common connection point. For example, the first switch 213 may not be directly coupled to the second switch 223 or the second plurality of diodes 225, and the first plurality of diodes 215 may not be directly coupled to the second switch 223 or the second plurality of diodes 225. Alternatively, or in addition, the first and second switches 213, 223 may be coupled in parallel with each other and the first and second pluralities of diodes 215, 225 may be coupled in parallel with each other.

Figure 3:
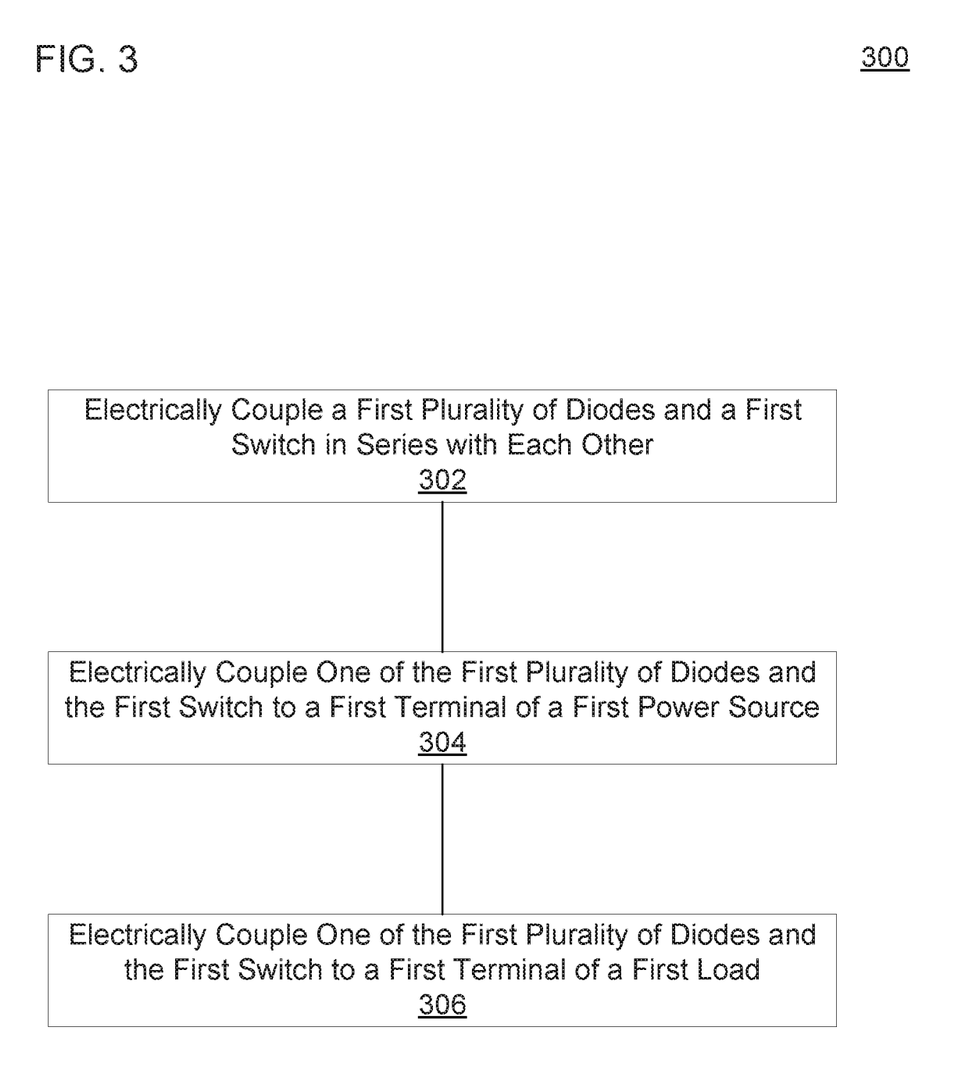
FIG. 3 is a flow diagram of an example method to couple a first power source to a load.

FIG. 3 is a flow diagram of an example method 300 to couple a first power source to a load. At block 302, a first plurality of diodes and a first switch may be electrically coupled in series with each other. In an example, the first plurality of diodes and the first switch may be the first plurality of diodes 215 and the first switch 213 of FIG. 2. The first plurality of diodes may be electrically coupled in series with each other and with the first switch. The first switch may include a control terminal, an input terminal, and an output terminal. The first plurality of diodes may be electrically coupled in series with the input or output terminals of the first switch. In one example, the first plurality of diodes and the first switch may be electrically coupled as seen in FIG. 2.

At block 304, one of the first switch and the first plurality of diodes may be electrically coupled to a first terminal of a first power source. For example, one of the first switch and the first plurality of diodes may be directly coupled to the first terminal of the first power source, and the other may be indirectly coupled when the first switch is allowing electrical energy to flow. In one example, the first power source may be the second power source 202 of FIG. 2, and the first plurality of diodes and the first switch may be coupled thereto as seen in FIG. 2.

At block 306, the method 300 may include electrically coupling one of the first switch and the first plurality of diodes to a first terminal of a load. For example, one of the first switch and the first plurality of diodes may be directly coupled to the first terminal of the load, and the other may be indirectly coupled when the first switch is passing current. In some examples, the one of the first switch and the first plurality of diodes directly coupled to the first terminal of the load may not be directly coupled to the first terminal of the first power source. Referring to FIG. 2, the load may be the first load 203, and the first plurality of diodes and the first switch may be coupled thereto as seen in FIG. 2.

The first switch may be electrically coupled so it can control the flow of electrical energy from the first power source to the load. For example, input and output terminals of the first switch may be coupled directly or indirectly to the first power source and first load. The first switch may be coupled so that the presence of absence of a voltage or current bias at the control terminal of the first switch may determine whether electrical energy is able to flow from the first power source to the load. The plurality of diodes may be electrically coupled so the plurality of diodes creates a potential drop between the first power source and the load when electrical energy is flowing. Each diode may include a threshold voltage. The forward bias voltage across the terminals of the diode may need to exceed the threshold voltage for significant amounts of electrical energy to flow through the diode. Accordingly, the diodes may be coupled so a potential drop between the first power source and the load is needed for electrical energy to flow from the first power source to the load.

Figure 4:
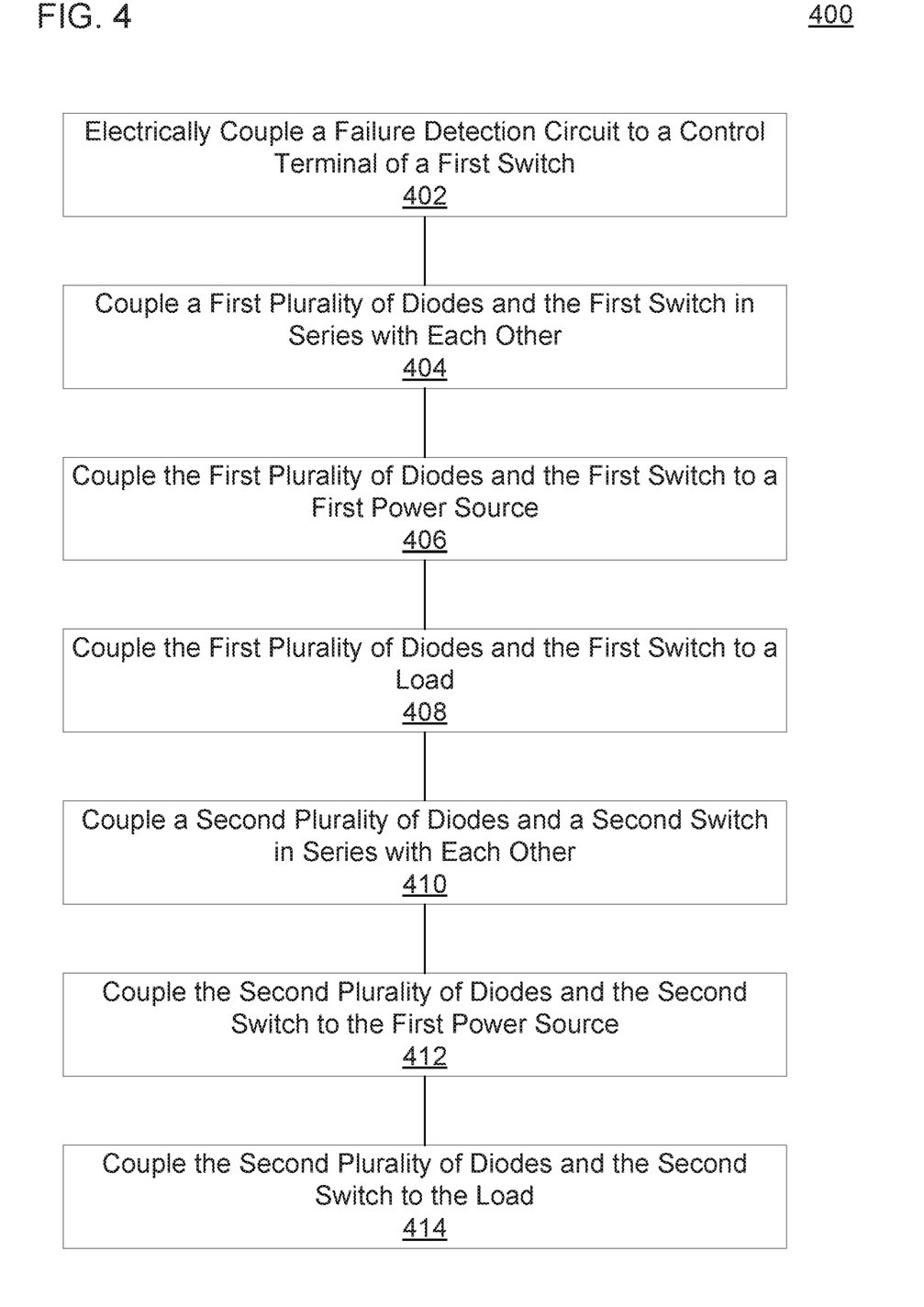
FIG. 4 is a flow diagram of another example method to couple a first power source to a load.

FIG. 4 is a flow diagram of another example method 400 to couple a first power source to a load. At block 402, the method 400 may include electrically coupling a failure detection circuit to a first switch. For example, the first switch may include a control terminal, an input terminal, and an output terminal. The failure detection circuit may be electrically coupled to the control terminal of the first switch. The failure detection circuit may be electrically coupled may be able to detect a failure of a second power supply. The failure detection circuit may be able to bias the control terminal of the first switch to allow power to flow from a first power source to a load based on the failure detection circuit detecting the failure. For example, the failure detection circuit may be electrically coupled so as to be able to bias the control terminal so the first switch is in an active state that allows electrical energy to flow between the input and output terminals. The failure detection circuit also may be able to instruct the first switch not to allow electrical energy to flow based on the failure detection circuit not detecting a failure or detecting that the failure has been remedied. Referring to FIG. 2, the failure detection circuit and the first switch may be, for example, the failure detection circuit 211 and the first switch 213 respectively. In one example, the second power source may be the first power source 201 of FIG. 2, and the failure detection circuit may be coupled to the first switch as seen in FIG. 2.

Block 404 may include electrically coupling a first plurality of diodes and the first switch in series with each other. In one example, the first plurality of diodes may be the first plurality of diodes 215 of FIG. 2. Block 406 may include electrically coupling one of the first switch and the first plurality of diodes to a first terminal of the first power source; and block 408 may include electrically coupling one of the first switch and the first plurality of diodes to a first terminal of the load. For example, the first power source may be the second power source 202 of FIG. 2; the load may be the first load 203 of FIG. 2; and the first switch and the first plurality of diodes may be coupled to each other, the first power source, and the load as seen in FIG. 2.

Block 410 may include electrically coupling a second plurality of diodes and a second switch in series with each other. In an example, referring to FIG. 2, the second plurality of diodes may be the third plurality of diodes 216, and the second switch may be the third switch 214. The second plurality of diodes may be electrically coupled in series with each other and in series with the second switch (e.g., in series with the input or output terminals of the second switch). In an example, the second plurality of diodes and second switch may be electrically coupled as seen in FIG. 2.

At block 412, the method 400 may include electrically coupling one of the second switch and the second plurality of diodes to a second terminal of the first power source. At block 414, the method 400 may include electrically coupling one of the second switch and the second plurality of diodes to a second terminal of the load. For example, one of the second switch and the second plurality of diodes may be directly coupled to the second terminal of first power source and the other may be directly coupled to the second terminal of the load. The second plurality of diodes and the second switch may be coupled to the first power source and the load as seen in FIG. 2 in an example.

The first plurality of diodes may be electrically coupled so as to create a first potential drop between the first terminal of the first power source and the first terminal of the load when electrical energy is flowing. The second plurality of diodes may be electrically coupled so as to create a second potential drop between the second terminal of the load and the second terminal of the first power source when electrical energy is flowing. The potential drop of each plurality of diodes may be the sum of the potential drops of the individual diodes electrically coupled in series. The quantity (i.e., number) of diodes in the first or second plurality of diodes may be selected so the first or second potential drop corresponds to a maximum voltage drop before detection by the failure detection circuit. The maximum voltage drop before detection may be the largest difference between the potential across the terminals of the first power source and the potential across the terminals of the load that can occur before the failure detection circuit detects a failure. In some examples, the first and second potential drops may include potential drops across the first and second switches respectively.

In one example, the number of diodes in the first and second pluralities of diodes is selected so the first potential drop plus the second potential drop exceeds the maximum voltage drop. Alternatively, the number of diodes may be selected so the maximum voltage drop exceeds the first potential drop plus the second potential drop by less than a predetermined value. For example, the predetermined value may be selected based on an expected current at the predetermined value (e.g., based on conductor, diode, and switch resistances). In some examples, there may be only a first plurality of diodes or only a second plurality of diodes and the number of diodes may be selected based on the first or second potential drop rather than the first potential drop plus the second potential drop.

The number of diodes in the first and second pluralities of diodes may be selected so that less than a maximum current is allowed to flow after the failure detection circuit instructs the first or second switches to allow electrical energy to flow. The first and second pluralities of diodes may include diodes selected to have a gradual increase in current with an increasing forward bias. For example, the diodes may include a forward bias region where current grows exponentially with increasing voltage and a resistive region for larger forward bias voltages where the bulk resistance of the diodes causes the current to asymptotically approach linear growth for increasing voltages. In some examples, the diodes pass a current of approximately 10, 20, 50, 100, 150 Amps, or the like for a voltage 5, 1, 2 Volts, or the like above a threshold voltage. Thus, the first and second plurality of diodes may pass less than the maximum current when biased by the maximum voltage drop. For example, selecting the number of diodes so that the first potential drop plus the second potential drop exceeds the maximum voltage drop may include calculating the first and second potential drops based on a threshold voltage of each diode, a voltage slightly above the threshold voltage, a voltage at which the diode passes the maximum current, or the like.

Figure 5A:
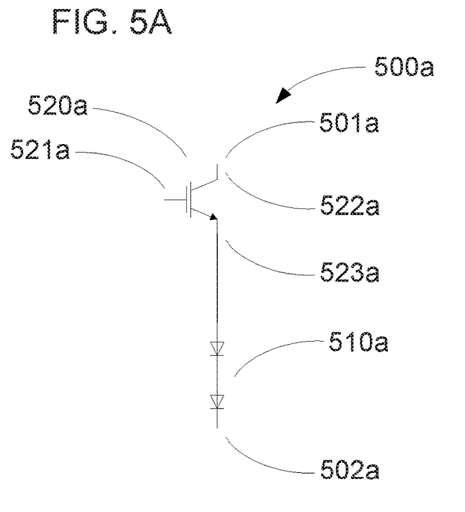
FIG. 5A is a schematic diagram of an example device to restrict current through a first switch.

FIG. 5A is a schematic diagram of an example device 500a to restrict current through a first switch 520a. The device 500a may include the first switch 520a, which may be coupled to a first terminal 501a. The first switch 520a may include a control terminal 521a, an input terminal 522a, and an output terminal 523a. The input terminal 522a may be electrically coupled to the first terminal 501a. The output terminal 523a may be electrically coupled with a second terminal 502a. The first switch 520a may selectively couple the first and second terminals 501a, 502a electrically based on the presence or absence of a bias voltage or current at the control terminal 521a. In the illustrated example, the input and output terminals 522a, 523a are identified based on the direction of conventional current flow. In other examples, the input and output terminals 522a, 523a may be identified based on the type of switch (e.g., p-type or n-type), based on the direction opposite conventional current flow, or the like. Similarly, the identification of the first and second terminals 501a, 502a may be swapped in some examples.

The device 500a may also include a plurality of diodes 510a electrically coupled in series with each other. The plurality of diodes 510a may be electrically coupled to the second terminal 502a. The plurality of diodes 510a may also be electrically coupled to the output terminal 523a of the first switch 520a. The plurality of diodes 510a may be electrically isolated from the control terminal 521a. As used herein, the term "electrically isolated" refers to components that are not electrically coupled to each other. Electrically isolated components may share a common rail. In the context of a control terminal of a switch, the term "electrically isolated" refers to components that are not electrically coupled to the control terminal other than through the input or output terminals of the switch. For example, the plurality of diodes 510a may be considered electrically isolated from the control terminal 521a even if the switch 520a were a BJT in an active state. The plurality of diodes 510a may be oriented to allow electrical energy to flow from the first terminal 501a to the second terminal 502a but may also create a potential drop between the first and second terminals 501a, 502a and restrict a current from the first terminal 501a to the second terminal 502a.

Figure 5B:
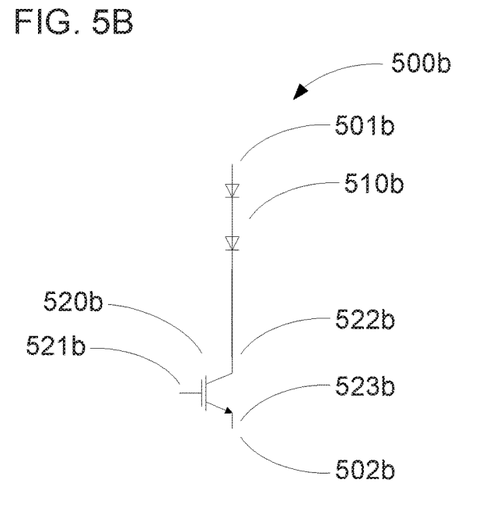
FIG. 5B is a schematic diagram of another example device to restrict current through a first switch.

FIG. 5B is a schematic diagram of another example device 500b to restrict current through a first switch 520b. The device 500b may include a plurality of diodes 510b electrically coupled to a first terminal 501b of the device 500b. The plurality of diodes 510b may be electrically coupled in series with each other. The device 500b may also include the first switch 520b, which may be electrically coupled to a second terminal 502b of the device 500b. The first switch 520b may include a control terminal 521b, an input terminal 522b, and an output terminal 523b. The first plurality of diodes 510b may be electrically coupled to the input terminal 522b of the first switch 520b and electrically isolated from the control terminal 521b. The output terminal 523b may be electrically coupled to the second terminal 502b.

Figure 5C:
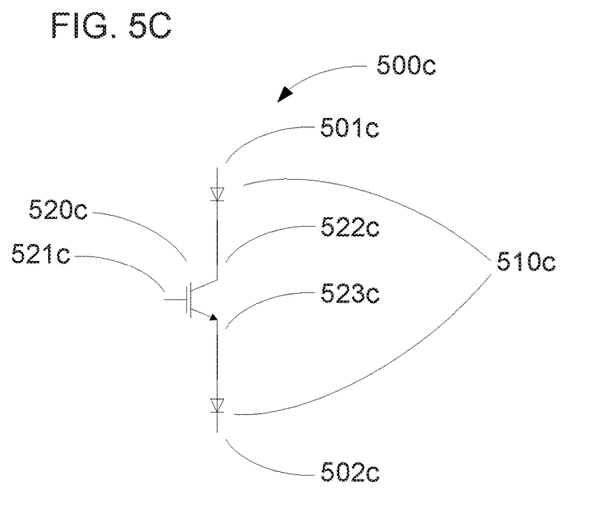
FIG. 5C is a schematic diagram of another example device to restrict current through a first switch.

FIG. 5C is a schematic diagram of another example device 500c to restrict current through a first switch 520c. The device 500c may include a plurality of diodes 510c. The device 500c may include the first switch 520c, which may be positioned amid the plurality of diodes 510c. For example, the first switch 520c may include a control terminal 521c, an input terminal 522c, and an output terminal 523c, and different diodes among the plurality of diodes 510c may be electrically coupled to the input and output terminals 522c, 523c of the first switch 520c. The plurality of diodes 510c may be electrically coupled in series with each other and may be electrically coupled to first and second terminals 501c, 502c. The plurality of diodes 510c may be electrically isolated from the control terminal 521c.

Figure 6A:
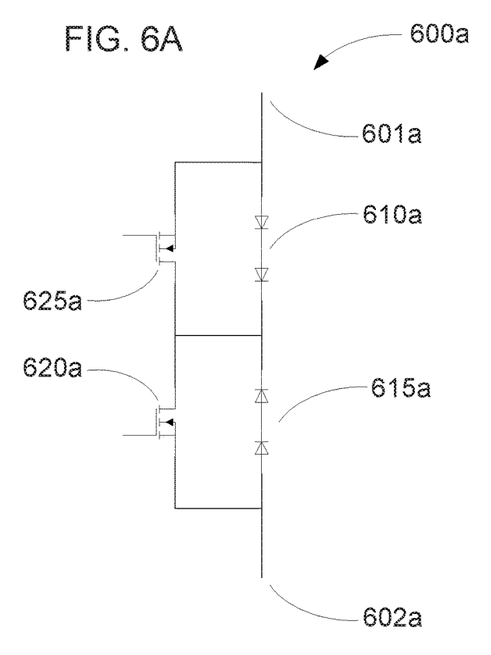
FIG. 6A is a schematic diagram of an example device to restrict current through first and second switches.

FIG. 6A is a schematic diagram of an example device 600a to restrict current through first and second switches 620a, 625a. The device 600a may include first plurality of diodes 610a in series with the first switch 620a. The first plurality of diodes 610a may be electrically coupled to a first terminal 601a, and the first switch 620a may be electrically coupled to a second terminal 602a. The first switch 620a may selectively couple the first terminal 601a to the second terminal 602a. The first plurality of diodes 610a may create a potential drop and restrict a current between the first terminal 601a and the second terminal 602a.

The device 600a may include the second switch 625a, which may be electrically coupled in parallel with the first plurality of diodes 610a and electrically coupled to the first terminal 601a. The second switch 625a may selectively couple the first switch 620a to the first terminal 601a electrically and bypass the plurality of diodes 610a. For example, the plurality of diodes 610a may restrict the current when the first switch 620a initially couples the first terminal 601a to the second terminal 602a. When the large initial current subsides, the second switch 625a may bypass the first plurality of diodes 610a to reduce energy consumed by the device 600a.

The device 600a may include a second plurality of diodes 615a. The second plurality of diodes 615a may be electrically coupled in parallel with the first switch 620a and electrically coupled in series with each other and the second switch 625a. The second plurality of diodes 615a may also be electrically coupled to the second terminal 602a. The second switch 625a may selectively couple the second terminal 602a to the first terminal 601a. For example, the first switch 620a may selectively couple the terminals 601a, 602a when electrical energy is to flow from the first terminal 601a to the second terminal 602a, and the second switch 625a may selectively couple the terminals 601a, 602a when electrical energy is to flow from the second terminal 602a to the first terminal 601a.

The second switch 625a may be a bidirectional device. It may be able to selectively bypass the first plurality of diodes 610a when electrical energy is to flow from the first terminal 601a to the second terminal 602a as well as selectively couple the second terminal 602a to the first terminal 601a when electrical energy is to flow from the second terminal 602a to the first terminal 601a. Similarly, the first switch 620a may be able to selectively bypass the second plurality of diodes 615a in addition to selectively coupling the first terminal 601a to the second terminal 602a when electrical energy is to flow from the first terminal 601a to the second terminal 602a.

A large current may flow when the pluralities of diodes 610a, 615a are bypassed due to the removal of the potential drop of the diodes. If there are multiple devices 600a (e.g., one for each pair of rails, in series, etc.), the plurality of diodes 610a, 615a may be bypassed one device at a time (e.g., the current may be allowed to dissipate before the next device bypasses its diodes). Alternatively, or in addition, there may be multiple bypass switches for each plurality of diodes, and each bypass switch may bypass a subset of the plurality of diodes smaller than the whole plurality. The multiple bypass switches may bypass the subsets one at a time to prevent a large current.

Figure 6B:
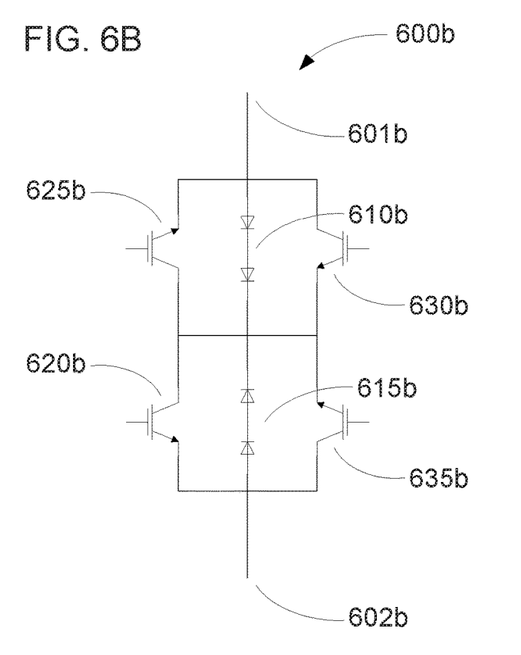
FIG. 6B is a schematic diagram of another example device to restrict current through first and second switches.

FIG. 6B is a schematic diagram of another example device 600b to restrict current through first and second switches 620b, 625b. The device 600b may include a first plurality of diodes 610b electrically coupled in series with the first switch 620b. The device 600b may also include a second plurality of diodes 615b electrically coupled in series with each other and in parallel with the first switch 620b. The device 600b may include the second switch 625b, which may be electrically coupled in parallel with the first plurality of diodes 610b and in series with the second plurality of diodes 615b. The first switch 620b may selectively couple a first terminal 601b to a second terminal 602b, and the second switch 625b may selectively couple the second terminal 602b to the first terminal 601b. The first and second switches 620b, 625b may be unidirectional devices that selectively allow the flow of electrical energy in one direction and always block the flow of electrical energy in the opposite direction (e.g., IGBTs, etc.). Accordingly, the first and second switches 620b, 625b may be unable to selectively bypass the second and first pluralities of diodes 615b, 610b respectively.

The device 600b may include a third switch 630b in parallel with the first pluralities of diodes 610b. The third switch 630b may be a unidirectional device oriented to selectively bypass the first plurality of diodes 610b. For example, the third switch 630b may control the flow of current in a direction parallel to a direction of conduction of the first plurality of diodes 610b. As used herein, flows of current are in a "parallel" direction if they both flow from a first common potential node to a second common potential node. The device 600b may also include a fourth switch 635b in parallel with the second plurality of diodes 615b. The fourth switch 635b may also be a unidirectional device and may be oriented to selectively bypass the second plurality of diodes 615b. In the illustrated example, the switches 620b, 625b, 630b, 635b and the diodes 610b, 615b may all be directly coupled to a common connection point. In other examples, the first and third switches 620b, 630b and the first plurality of diodes 610b may be electrically coupled in parallel with the second and fourth switches 625b, 635b and the second plurality of diodes 615b without a common connection point for all the devices.

Figure 6C:
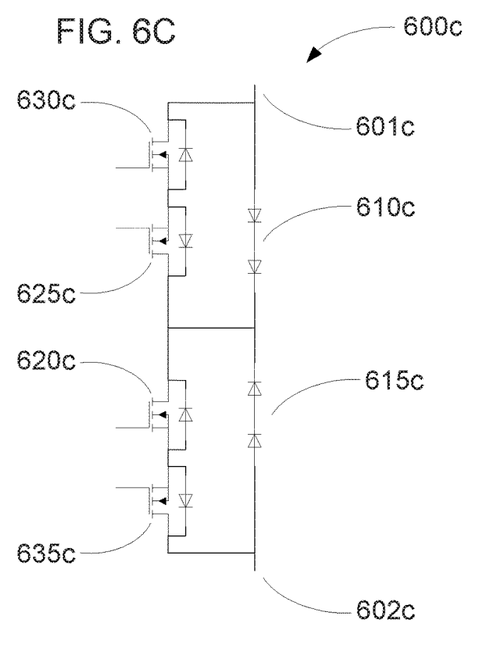
FIG. 6C is a schematic diagram of another example device to restrict current through first and second switches.

FIG. 6C is a schematic diagram of another example device 600c to restrict current through first and second switches 620c, 625c. The device 600c may include a first plurality of diodes 610c electrically coupled in series with each other. The device 600c may include the first switch 620c, which may be electrically coupled in series with the first plurality of diodes 610c. The device 600c may also include a second plurality of diodes 615c electrically coupled in series with each other. The device may include the second switch 625c, which may be electrically coupled in series with the second plurality of diodes 615c. The first and second switches 620c, 625c may be unidirectional devices that selectively allow the flow of electrical energy in one direction and allow the flow of electrical energy in the opposite direction if a threshold voltage is exceeded (e.g., power MOSFETs having a body diode, IGBTs electrically coupled in parallel with an antiparallel diode, etc.).

The device 600c may include a third switch 630c electrically coupled in series with the second switch 625c and in parallel with the first plurality of diodes 610c. The third switch 630c may selectively bypass the first plurality of diodes 610c. When the third switch 630c is bypassing the first plurality of diodes 610c, the second switch 625c also may be biased to an active state or may allow electrical energy to flow through its body or antiparallel diode. Similarly, the third switch 630c may be biased to an active state or may allow electrical energy to flow through its body or antiparallel diode when the second switch 625c electrically couples a second terminal 602c to a first terminal 601c. The device may also include a fourth switch 635c electrically coupled in series with the first switch 620c and in parallel with the second plurality of diodes 615c. The fourth switch 635c may selectively bypass the second plurality of diodes 615c but allow electrical energy to flow when the first switch 620c selectively couples the first terminal 601c to the second terminal 602c.

In some of the examples of devices to restrict current 500a-c, 600a-c, the number of diodes in a particular plurality of diodes may be selected to have a voltage drop corresponding to a detection threshold of a detection device coupled to a control terminal of a switch in series with the particular plurality of diodes. The detection threshold may be how far the voltage of a power source needs to drop before the detection device detects a failure of the power source. The voltage drop of the plurality of diodes may be the sum of the threshold voltages of the diodes, the sum of voltages slightly above the threshold voltages, the sum of voltages at a maximum current the plurality of diodes are to pass, or the like. If multiple devices to restrict current are used (e.g., a device for each pair of rails, multiple devices in series, etc.), the voltage drops of other devices may be taken into account when selecting the number of diodes. For example, if there will only be a single device, the number of diodes may be selected to have a voltage drop near or exceeding the detection threshold. If there will be multiple devices, the number of diodes may be selected to have a voltage drop near or exceeding the detection threshold minus the voltage drops of other devices or the detection threshold divided by the number of devices.

Figure 7:
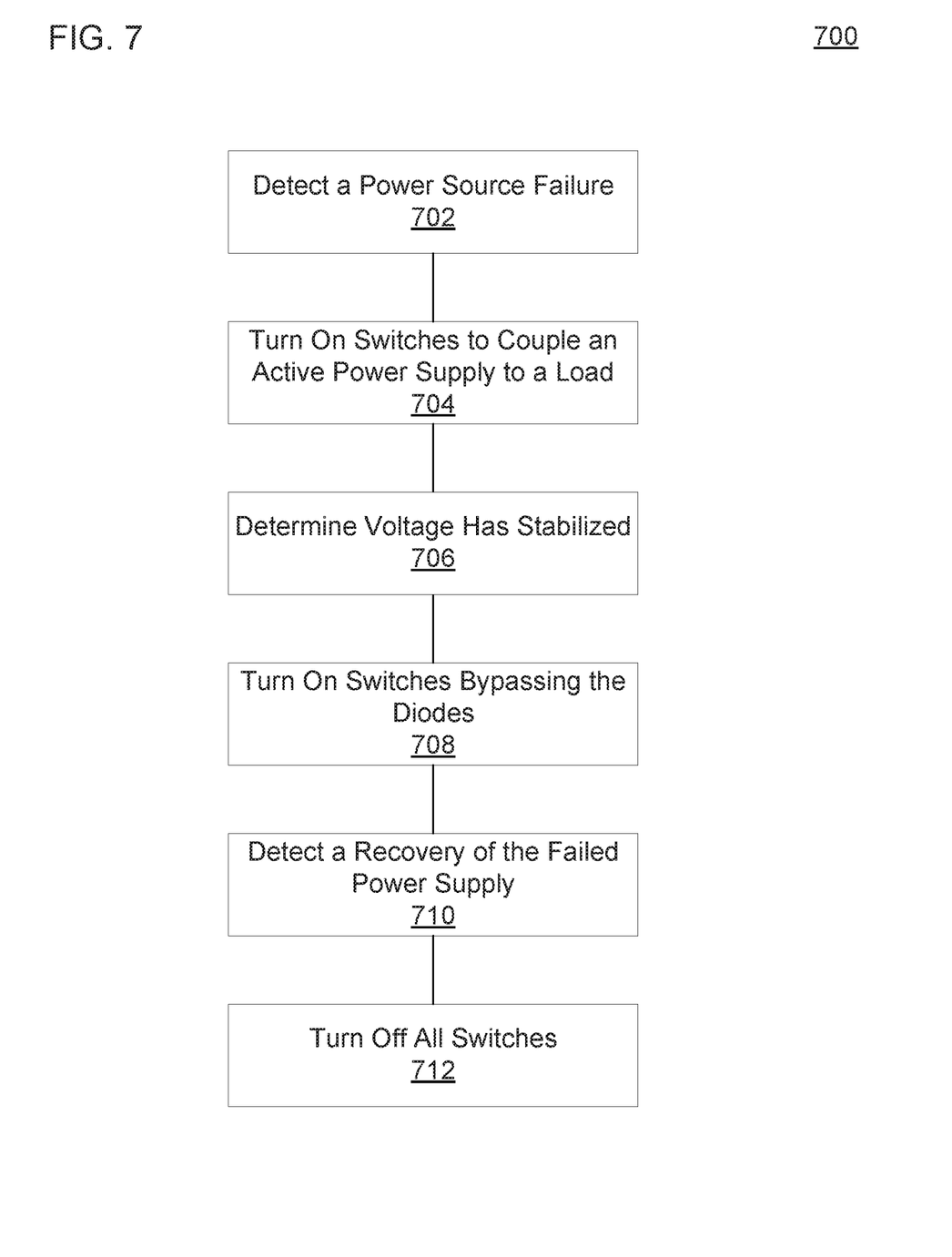
FIG. 7 is a flow diagram of an example method to mitigate a power source failure.

FIG. 7 is a flow diagram of an example method 700 to mitigate a power source failure. At block 702, the method 700 may include a detecting a power source failure. For example, the power source failure may be detected by detecting a decline in a voltage output by the power source, receiving an indication of a fault from the power source, or the like. Block 704 may include turning on switches to electrically couple an active power source to a load. The switches may be biased to an active state in which they allow electrical energy to flow from the active power source to the load. There may be a plurality of diodes in series with the switches, so the current from the active power source to the load may be restricted. Referring to FIG. 2, the first failure detection circuit 211 may detect power source failures and turn on switches to couple the active power source to the load in some examples.

At block 706, the method 700 may include determining the voltage has stabilized. It may be determined that the voltage has stabilized if the difference in potential between the active power source and the load is less than a predetermined threshold, if less than a predetermined current is flowing, or the like. For example, the first or second failure detection circuit 211, 221 may detect that the voltage has stabilized. Block 708 may include turning on switches bypassing the diodes. Once the voltage has stabilized, there may no longer be a need to restrict current from the active power source to the load. Then, the diodes can be bypassed so the diodes do not continue to dissipate energy. In some examples, the first failure detection circuit 211 of FIG. 2 may turn on the bypass switches, or the second failure detection circuit 221 may turn on the bypass switches (e.g., in response to an indication from the first failure detection circuit, in response to detecting the voltage has stabilized, or the like).

Block 710 may include detecting a recovery of the failed power supply. The recovery may be detecting by detecting that a fault indication has been cleared, detecting the failed power supply is able to output electrical energy at a desired voltage, or the like. The first failure detection circuit 211 of FIG. 2, for example, may detect the recovery of the failed power supply. At block 712, the method 700 may include turning off all switches. Turning off all switches may include turning off bypass switches and turning off the switches coupling the active power supply to the load. For example, the switches may be biased to a cutoff state in which electrical energy does not flow through the switches. In some examples, the first or second failure detection circuits 211, 221 of FIG. 2 may turn off the switches.

The above description is illustrative of various principles and implementations of the present disclosure. Numerous variations and modifications will become apparent to those skilled in the art once the above disclosure is fully appreciated. Accordingly, the scope of the present application should be determined only by the following claims.

What is claimed is:

1. A system, comprising:
a failure detection circuit to:
  detect a failure of a first power source electrically coupled to a first load,
  output a first signal indicating detection of a failure of the first power source,
  detect a failure of the second power source, wherein the second power source is coupled to a second load, and
  output a second signal indicating detection of a failure of the second power source; and
a current regulating circuit electrically coupled to the failure detection circuit, the current regulating circuit to:
  selectively couple a second power source to the first load in response to the first signal indicating detection of a failure of the first power source,
  restrict a current supplied from the second power source to the first load by limiting a current from the second power source to the first load relative to an unrestricted current without entirely stopping the current,
  selectively couple the first power source to the second load in response to the second signal indicating a failure of the second power source, and
  restrict a current supplied from the first power source to the second load;
wherein the current regulating circuit includes:
  a first plurality of diodes electrically coupled in series with each other;
  a first switch electrically coupled in series with the first plurality of diodes;
  a second plurality of diodes electrically coupled in series with each other and in parallel with the first switch; and
  a second switch electrically coupled in series with the second plurality of diodes and in parallel with the first plurality of diodes,
wherein the first plurality of diodes are to allow current to flow from the second power source to the first load and the second plurality of diodes are to allow current to flow from the first power source to the second load.

2. The system of claim 1, wherein the current regulating circuit includes a plurality of diodes electrically coupled in series with each other, wherein the current regulating circuit electrically couples the second power source to the first load through the plurality of diodes, and wherein the plurality of diodes restrict the current from the second power source.

3. The system of claim 1, wherein the failure detection circuit is to electrically couple a first rail of the second power source to a first rail of the first load and a second rail of the second power source to a second rail of the first load in response to detecting the failure.

4. A method, comprising:
electrically coupling a first plurality of diodes and a first switch in series with each other;
electrically coupling one of the first switch and the first plurality of diodes to a first terminal of a first power source; and
electrically coupling one of the first switch and the first plurality of diodes to a first terminal of a load, thereby defining a first current path through the first switch and the first plurality of diodes between the first terminal of the first power source and the first terminal of the load;
wherein the first switch is electrically coupled so as to control a flow of current from the first power source to the load through the first current path, and wherein the first plurality of diodes is electrically coupled so as to create a potential drop between the first power source and the load when current is flowing.

5. The method of claim 4, further comprising:
electrically coupling a second plurality of diodes and a second switch in series with each other;
electrically coupling one of the second switch and the second plurality of diodes to a second terminal of the first power source; and
electrically coupling one of the second switch and the second plurality of diodes to a second terminal of the load, thereby defining a second current path through the second switch and the second plurality of diodes between the second terminal of the first power source and the second terminal of the load.

6. The method of claim 4, further comprising electrically coupling a failure detection circuit to a control terminal of the first switch, the failure detection circuit to detect a failure of a second power source and bias the control terminal based on detecting the failure.

7. The method of claim 6, wherein the potential drop corresponds to a maximum voltage drop before detection by the failure detection circuit.

8. The method of claim 6, wherein electrically coupling the first plurality of diodes and the first switch comprises selecting a quantity of diodes in the first plurality of diodes that allows less than a maximum current to flow after the failure detection circuit instructs the first switch to allow current to flow.

9. A system, comprising:
a first power source electrically connected to a first load to supply power to the first load;
a second power source electrically connected to a second load to supply power to the second load; and
failover circuitry to
selectively electrically connect the first power source to the second load via a first conduction path in response to a failure of the second power source; and
selectively electrically connect the second power source to the first load via a second conduction path in response to a failure of the first power source;
wherein:
the first conduction path includes a first set of diodes connected in series and configured to restrict current flowing through the first conduction path,
the first conduction path includes a switch connected in series with the first set of diodes,
the second conduction path includes a second set of diodes connected in series and configured to restrict current flowing through the second conduction path, and
the failover circuitry is to selectively electrically connect the first power source to the second load by closing the switch.

* * * * *